United States Patent
Kawase

(10) Patent No.: US 9,742,425 B2
(45) Date of Patent: Aug. 22, 2017

(54) ROTATION DETECTOR AND ROTATION DETECTION METHOD

(71) Applicant: Tatsuya Kawase, Kanagawa (JP)

(72) Inventor: Tatsuya Kawase, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 119 days.

(21) Appl. No.: 14/682,194

(22) Filed: Apr. 9, 2015

(65) Prior Publication Data
US 2015/0292907 A1 Oct. 15, 2015

(30) Foreign Application Priority Data

Apr. 11, 2014 (JP) .................................. 2014-081930

(51) Int. Cl.
| | | |
|---|---|---|
| G01B 7/30 | (2006.01) |
| H03M 1/66 | (2006.01) |
| G01D 5/14 | (2006.01) |
| G01D 5/244 | (2006.01) |
| H03M 1/30 | (2006.01) |

(52) U.S. Cl.
CPC ............ *H03M 1/668* (2013.01); *G01D 5/145* (2013.01); *G01D 5/24471* (2013.01); *H03M 1/303* (2013.01)

(58) Field of Classification Search
CPC .............................. G01D 5/145; G01D 5/2448
USPC ..................................................... 324/207.25
See application file for complete search history.

(56) References Cited

U.S. PATENT DOCUMENTS

| | | | | |
|---|---|---|---|---|
| 7,231,325 B2 * | 6/2007 | Motz | .................... | G01D 5/2448 324/200 |
| 8,860,346 B2 * | 10/2014 | Shimizu | ................ | H02P 21/146 318/400.01 |
| 2014/0347040 A1 | 11/2014 | Kawase | | |
| 2014/0354271 A1 | 12/2014 | Kawase | | |

FOREIGN PATENT DOCUMENTS

| | | |
|---|---|---|
| JP | 2005-168280 | 6/2005 |
| JP | 2008-082739 | 4/2008 |
| JP | 2012-083236 | 4/2012 |
| JP | 2013-002835 | 1/2013 |
| JP | 2014-211353 | 11/2014 |
| JP | 2014-240875 | 12/2014 |

* cited by examiner

*Primary Examiner* — Reena Aurora
(74) *Attorney, Agent, or Firm* — Harness, Dickey & Pierce P.L.C.

(57) ABSTRACT

A rotation detector detecting rotation of a rotor, based on a signal produced according to rotation of the rotor, having a waveform according to a rotational cycle thereof, includes a signal obtaining unit to obtain two signals having phases different from each other; a vector operating unit to determine a vector according to a rotational angle of the rotor, based on the two signals; and a rotation detecting unit to detect rotation of the rotor, based on the vector. The two signals are produced from two elements located at positions farthest in a rotational angle of the rotor among plural rotation detecting elements located at positions different from each other.

19 Claims, 9 Drawing Sheets

ROTATION DETECTOR AND ROTATION DETECTION METHOD

CROSS-REFERENCE TO RELATED APPLICATIONS

This patent application is based on and claims priority pursuant to 35 U.S.C. §119 to Japanese Patent Application No. 2014-081930, filed on Apr. 11, 2014, in the Japan Patent Office, the entire disclosure of which is hereby incorporated by reference herein.

BACKGROUND

Technical Field

The present invention relates to rotation detector and a rotation detection method, and particularly to reduction of detection error due to eccentricity of a rotor.

Description of the Related Art

As a method of detecting an angle of a rotor such as a brushless motor, there is a method of using a magetoelectric transducer such as hall elements producing a signal having an amplitude in accordance with a magnetic field applied. Japanese published unexamined application No. JP-2013-002835-A discloses a method of determining an angle of a rotor generating a magnetic field with a magetoelectric transducer, based on an amplitude of a signal produced in accordance with a rotational angle of the rotor.

In order to reduce an angle error due to due to eccentricity of a rotor, Japanese published unexamined application No. JP-2013-002835-A also discloses a rotor including a magnet having a maximum length in a magnetization direction shorter than a maximum length in a direction perpendicular to a rotational axis of the rotor and the magnetization direction.

In detecting a rotational position of a rotor, it is important to consider an error of the rotor. When the method disclosed in Japanese published unexamined application No. JP-2013-002835-A is used, a design of the rotor is limited. Particularly, the brushless motor is required to increase the number of poles. However, the method disclosed in Japanese published unexamined application No. JP-2013-002835-A limits the number to two.

SUMMARY

Accordingly, one object of the present invention is to provide detection of rotational position of a rotor in consideration of an error due to eccentricity thereof without a limit on the design thereof.

Another object of the present invention is to provide a method of the detection.

These objects and other objects of the present invention, either individually or collectively, have been satisfied by the discovery of a rotation detector detecting rotation of a rotor, based on a signal produced according to rotation of the rotor, having a waveform according to a rotational cycle thereof, including a signal obtaining unit to obtain two signals having phases different from each other; a vector operating unit to determine a vector according to a rotational angle of the rotor, based on the two signals; and a rotation detecting unit to detect rotation of the rotor, based on the vector, wherein the two signals are produced from two elements located at positions farthest in a rotational angle of the rotor among plural rotation detecting elements located at positions different from each other.

These and other objects, features and advantages of the present invention will become apparent upon consideration of the following description of the preferred embodiments of the present invention taken in conjunction with the accompanying drawings.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

DETAILED DESCRIPTION

Figure 1:
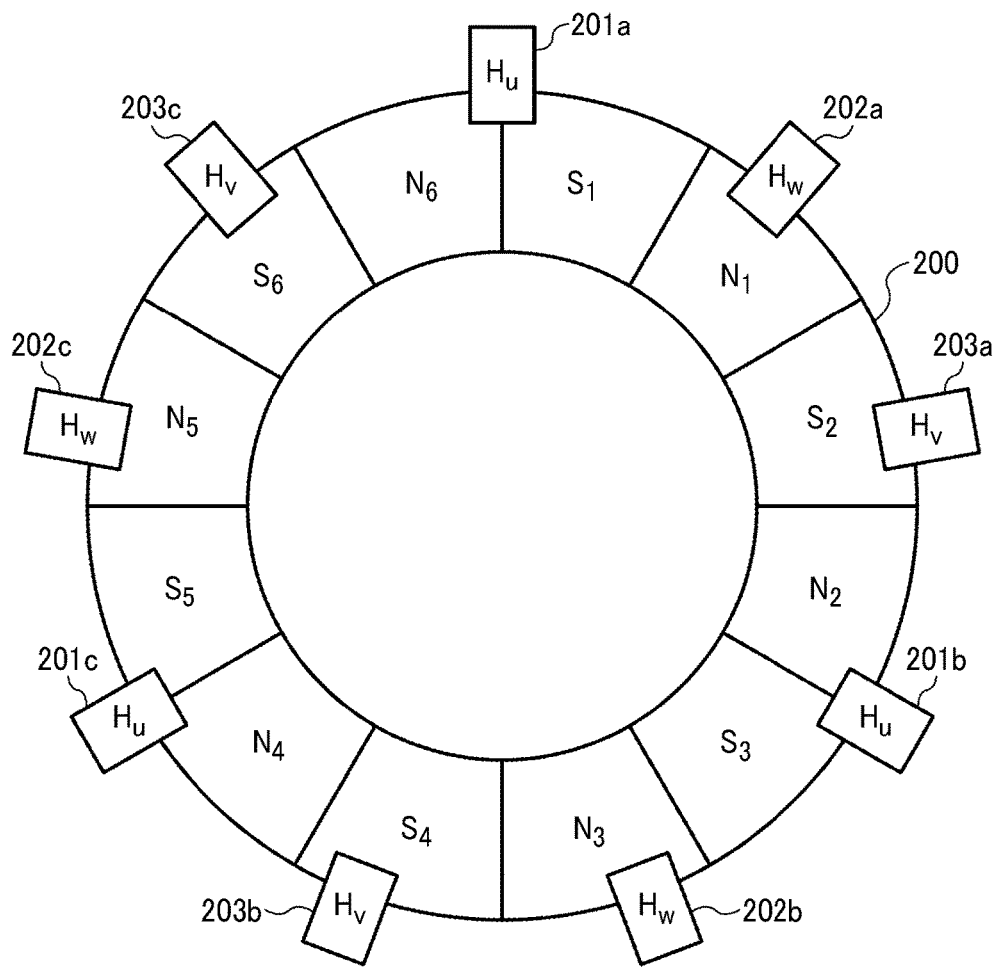
FIG. 1 is a schematic view illustrating a positional relation between a rotor and a magnetic sensor of an embodiment of a brushless motor of the present invention.

The present invention provides detection of rotational position of a rotor in consideration of an error due to eccentricity thereof without a limit on the design thereof.

Exemplary embodiments of the present invention are described in detail below with reference to accompanying drawings. In describing exemplary embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

In the embodiment, a rotation detector detecting a rotational position of a rotor in a 3-phase 12-electrode brushless motor is explained. The rotation detector reduces detection error due to eccentricity of the rotor when detecting an angle, based on a signal produced by a magnetic sensor located according to a rotational position of the rotor.

FIG. 1 is a schematic view illustrating locative embodiments of hall elements relative to a rotor 200 in an embodiment of a 3-phase 12-electrode brushless motor of the present invention. As shown in FIG. 1, in the 3-phase 12-electrode brushless motor, U-phase hall elements 201a, 201b and 201c (hereinafter referred to as "hall elements 201"), W-phase hall elements 202a, 202b and 202c (hereinafter referred to as "hall elements 202"), and V-phase hall elements 203a, 203b and 203c (hereinafter referred to as "hall elements 203") are located in this order at every 40° on a rotor 200 formed of magnets in the shape of a circle such that S poles and N poles interchange each other at every 30°.

The hall elements are located at every 40° over a round, which is one of embodiments. The 3-phase brushless motor has only to include U-phase, W-phase and V-phase hall elements located at positions shifted by 2π/3 each relative to an angle of one cycle of the S poles and N poles. However, in the embodiment, among the hall elements, outputs of the hall elements located at an angle shifted by as close as possible to 180° in a mechanical angle of the rotor. This is mentioned later.

Figure 2:
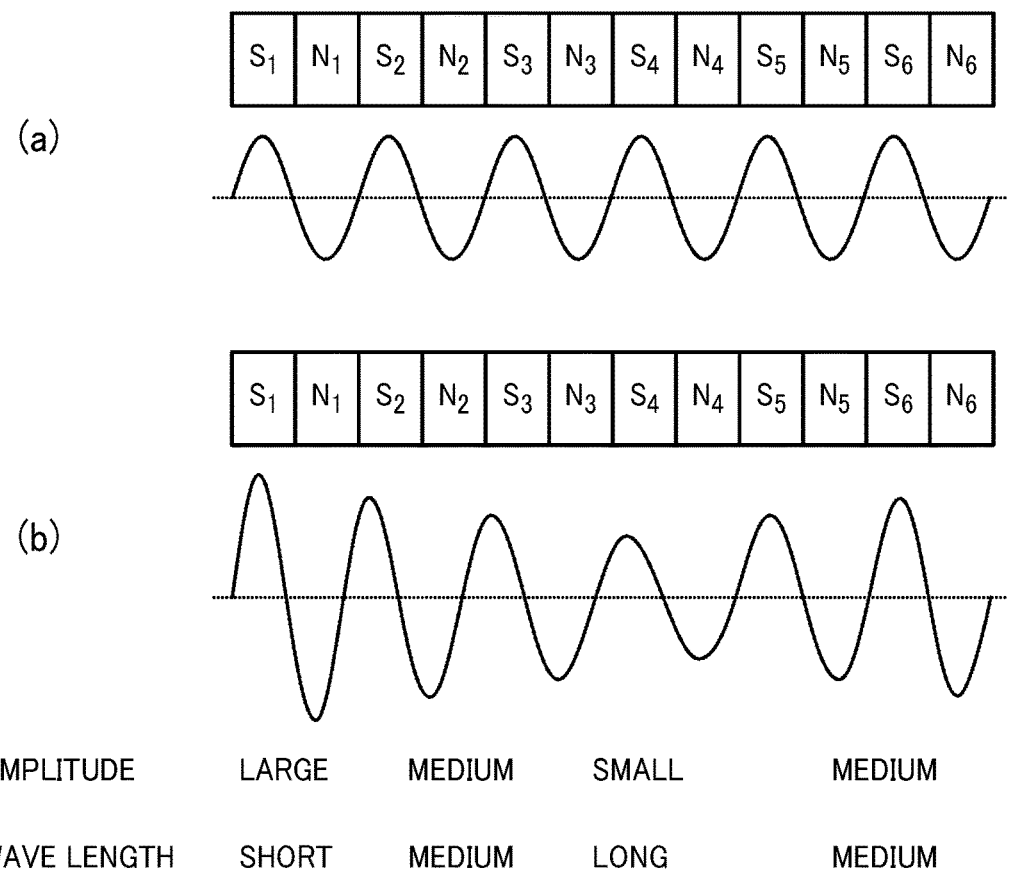
FIGS. 2 (*a*) and 2 (*b*) are schematic views illustrating an embodiment of a signal produced by the magnetic sensor according to a positional relation with a polarity of the rotor.

In FIG. 2 (a), the magnets in a rotational direction of the rotor 200 in FIG. 1 are virtually lined and relevant output signals of the hall elements at respective polarity positions are shown. As FIG. 2 (a), the hall elements 201, 202 and 203 produce signals having the shape of sine curves according to rotation of the rotor 200 so as to have the largest positive amplitude when facing the S pole and largest negative amplitude when facing the N pole.

One cycle of sine curves produced by the hall elements 201, 202 and 203 is one cycle of the S poles and N poles of the magnets included in the rotor 200, i.e., equivalent to a rotational angle of 60° of the rotor. Therefore, when the rotor rotates once, the sine curves produced by the hall elements 201, 202 and 203 are 6 cycles as shown in FIG. 2 (a).

The sine curve of the hall element according to a rotational position of the rotor 200 is ideally the same sine curve when the rotor rotates once. When the rotor 200 eccentrically rotes or includes magnets having magnetization eccentricity, an error according to one cycle when the rotor rotates once. FIG. 2 (b) is an example of the error.

As FIG. 2 (b) shows, the error of the sine curve due to the rotational eccentricity of the rotor 200 and the magnetization eccentricity influences on an amplitude and a wavelength of the sine curve. Namely, the rotational eccentricity and the magnetization eccentricity enlarge the amplitude and shorten the wavelength at a position where variation of a magnetic flux to the hall element per unit time increases, and downsize the amplitude and lengthen the wavelength at a position where variation of a magnetic flux to the hall element per unit time decreases.

When a rotational angle of the rotor 200 is detected, based on the sine curve having the error in FIG. 2 (b), even the detected angle has an error. In the present invention, the error is reduced to detect more precise angle.

Figure 3:
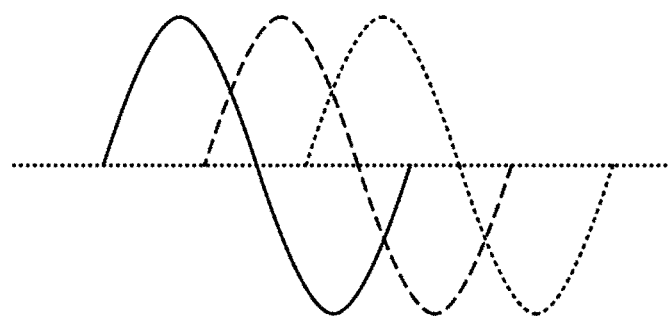
FIG. 3 is a schematic view illustrating phase differences of signals produced by the respective magnetic sensors.

FIG. 3 is a schematic view illustrating phase differences of sine curves produced by the hall elements 201, 202 and 203, respectively. In FIG. 3, output signal of the U-phase is denoted by a solid line, output signal of the W-phase is denoted by a broken line, and output signal of the V-phase is denoted by a dotted line. As FIG. 3 shows, the hall elements 201, 202 and 203 produce signals shifted by 120° each other as phases in the shape of sine curves.

Figure 4:
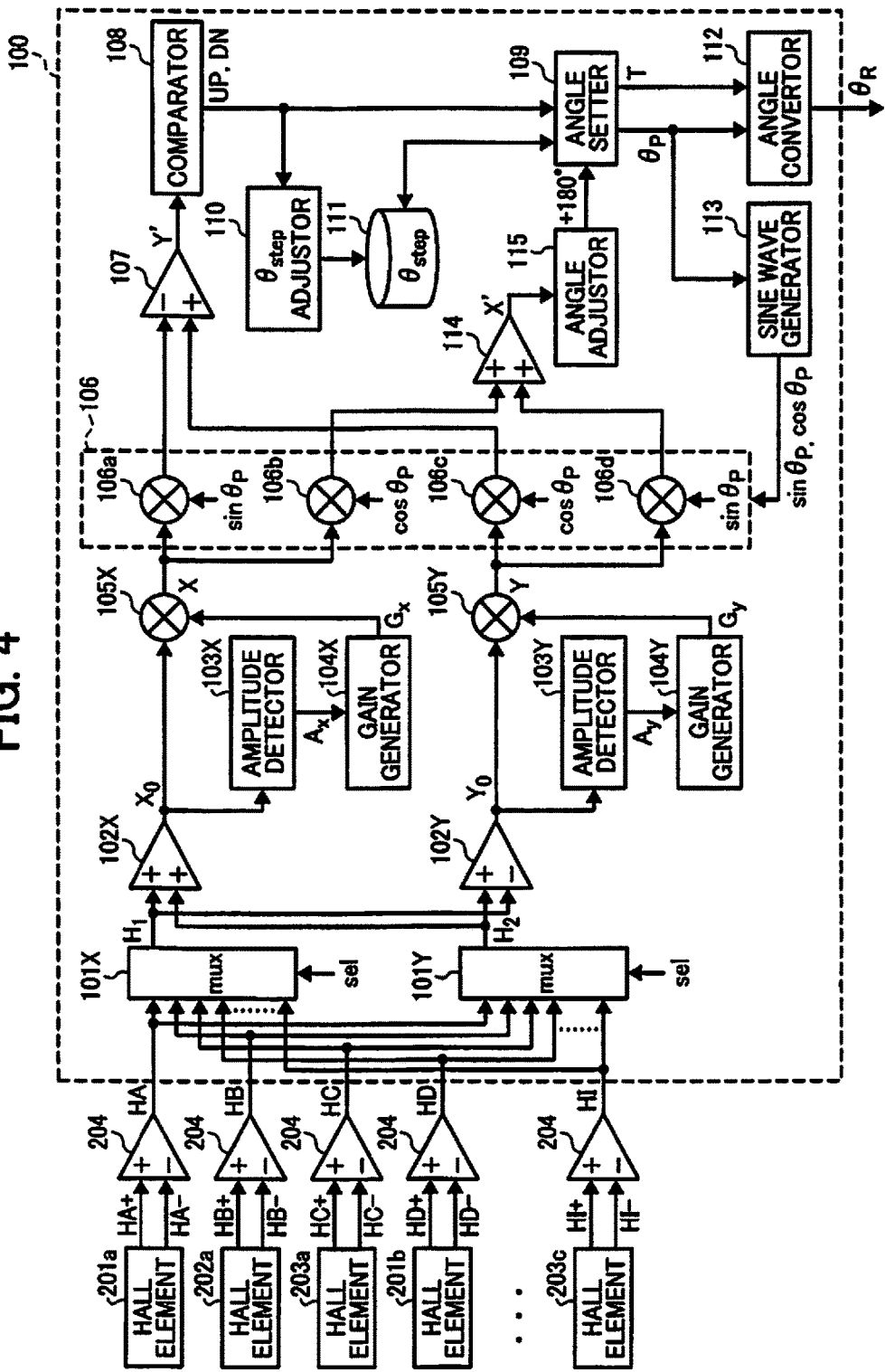
FIG. 4 is a block diagram showing functional configuration of an embodiment of the rotation detector of the present invention.

An embodiment of the rotation detector 100 of the present invention is explained, referring to FIG. 4. As FIG. 4 shows, the rotation detector 100 obtains sensor signals HA to HI which are single-ended differential output signals of the hall elements 201, 202 and 203 in FIG. 1 by differential amplifiers 204. The rotational position of the rotor 200 is detected, based on two signals having phases different from each other among the signals.

The sensor signals HA to HI entered in the rotation detector 100 are entered in mux (multiplexer) 101X and 101Y. Namely, the mux 101X and 101Y work as signal obtainers. The multiplexer 101X and 101Y select signals having phases different from each other, i.e., signals having different U-phase, V-phase and W-phase, based on select signals sel. The mux 101X and 101Y produce sensor signals $H_1$ and $H_2$ to a summing amplifier 102X and a differential gain amplifier 102Y. The select signals sel are set and entered by an outer CPU (Central Processing Unit) by means of register setting.

The summing amplifier 102X produces $X_0$ signal from the following formula (1).

$$X_0 = H_1 + H_2 \tag{1}$$

The differential gain amplifier 102Y produces $Y_0$ signal from the following formula (2).

$$Y_0 = K \times (H_2 - H_1) \tag{2}$$

wherein K is determined from a phase difference between $H_1$ and $H_2$ and a coefficient of a gain set such that $X_0$ and $Y_0$ have the same amplitude. The thus produced $X_0$ and $Y_0$ are orthogonal each other.

The $X_0$ signal produced by the summing amplifier 102X is entered in a gain multiplier 105X and an amplitude detector 103X. The amplitude detector 103X detects an amplitude $A_x$ of the $X_0$ signal and enters the amplitude $A_x$ in a gain generator 104X. The amplitude detector 103X is realized by a peak detection circuit. The peak detection is made by positive and negative peak of a signal, and the negative peak is converted to an absolute value.

The gain generator 104X determines a gain $G_x$ from the following formula (3) to accord the amplitude of the signal $X_0$ to a predetermined amplitude $A_{tgt}$. The gain $G_x$ is entered in the gain multiplier 105X. The gain multiplier 105X makes multiplication of the signal $X_0$ and the gain $G_x$, and produces a signal X according the amplitude to the predetermined amplitude $A_{tgt}$.

$$G_x = A_{tgt}/A_x \tag{3}$$

The $Y_0$ signal produced by the differential gain amplifier 102Y is entered in a gain multiplier 105Y and an amplitude detector 103Y. The amplitude detector 103Y detects an amplitude $A_y$ of the $Y_0$ signal and enters the amplitude $A_y$ in a gain generator 104Y. The amplitude detector 103Y is realized by a peak detection circuit. The peak detection is made by positive and negative peak of a signal, and the negative peak is converted to an absolute value.

The gain generator 104Y determines a gain $G_y$ from the following formula (4) to accord the amplitude of the signal $Y_0$ to a predetermined amplitude $A_{tgt}$. The gain $G_y$ is entered in the gain multiplier 105Y. The gain multiplier 105Y makes multiplication of the signal $Y_0$ and the gain $G_y$, and produces a signal Y according the amplitude to the predetermined amplitude $A_{tgt}$.

$$G_y = A_{tgt}/A_y \tag{4}$$

Figure 5:
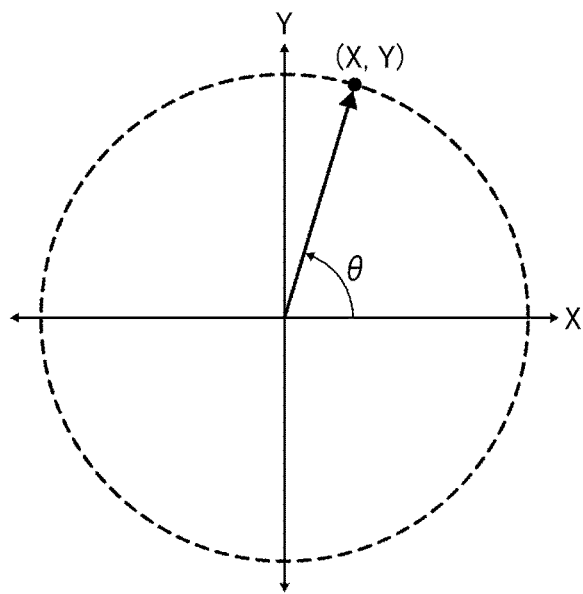
FIG. 5 is a diagram showing an embodiment of a vector angle of the present invention.

The thus produced signals X and Y are orthogonal each other as the $X_0$ and $Y_0$, and gain-operated to accord a peak of amplitude. Therefore, an angle of vector denoted by X and Y can denote a rotational position θ of the rotor 200 as shown in FIG. 5.

Namely, the summing amplifier 102X, the differential gain amplifier 102Y, the amplitude detectors 103X and 103Y, the gain generators 104X and 104Y, and the gain multipliers 105X and 105Y are connected with each other to work as a vector operator. The signals X and Y are entered in a detective angle multiplier 106.

In the detective angle multiplier 106, the signal X is entered in a sine wave multiplier 106a and a cosine wave multiplier 106b, and the signal Y is entered in a cosine wave multiplier 106c and a sine wave multiplier 106d. $\sin\theta_p$ and $\cos\theta_p$ based on a detective angle $\theta_p$ set according to an operation of the rotation detector 100 are entered in the detective angle multiplier 106.

The sine wave multiplier 106a multiplies $\sin\theta_p$ with the signal X. The cosine wave multiplier 106b multiplies $\cos\theta_p$ with the signal X. The cosine wave multiplier 106c multiplies $\cos\theta_p$ with the signal Y. The sine wave multiplier 106d multiplies $\sin\theta_p$ with the signal Y.

Signals produced from the sine wave multiplier 106a and the cosine wave multiplier 106b are entered in a subtraction amplifier 107. The subtraction amplifier 107 produces Y' signal from the following formula (5).

$$Y' = -X \times \sin\theta_p + Y \times \cos\theta_p \tag{5}$$

Signals produced from the cosine wave multiplier 106c and the sine wave multiplier 106d are entered in a summing amplifier 114. The summing amplifier 114 produces X' signal from the following formula (6).

$$X' = X \times \cos\theta_p + Y \times \sin\theta_p \tag{6}$$

The formulae (5) and (6) rotate vectors denoted by X and Y clockwise by $\theta_p$.

Figure 6:
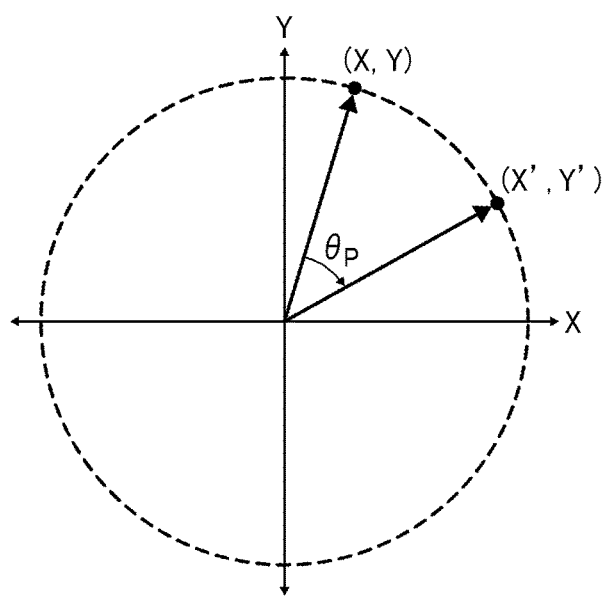
FIG. 6 is a diagram showing a conception of angle detection according to an embodiment of a vector angle of the present invention.

Therefore, the vectors denoted by X and Y are rotated clockwise by $\theta_p$ to be vectors denoted by X' and Y' as shown in FIG. 6.

Namely, when $\theta = \theta_p$, Y' is zero and X' is the amplitude $A_{tgt}$ in the formulae (3) and (4). In the present embodiment, while $\theta_p$ is controlled such that X' and Y' are constantly $A_{tgt}$ and 0, respectively, the detective angle of the rotor is determined, based on $\theta_p$.

In the present embodiment, a case in which $\theta = \theta_p$, i.e., a case in which the standard angle is 0° is an example. However, angles in FIGS. 5 and 6 themselves do not have meanings and variation thereof corresponds to a rotational angle of the rotor 200. Therefore, the standard angle is not limited to 0°.

The signal Y' is entered in a comparator 108. The comparator 108 judges whether the signal Y' is 0, and produces a signal to change $\theta_p$ according to the judgment. The operation of the comparator 108 is explained, referring to FIG. 7.

Figure 7:
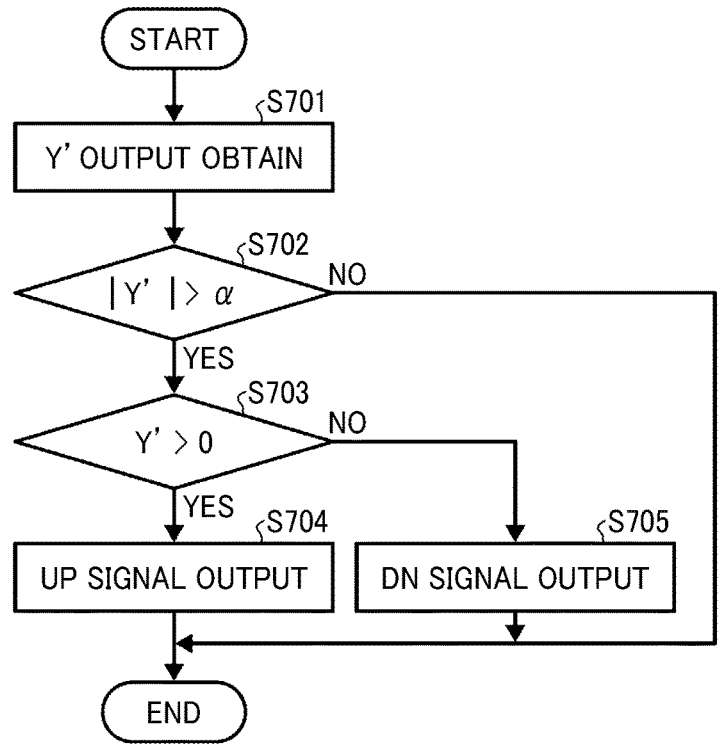
FIG. 7 is a flowchart showing operation of an embodiment of a comparator of the present invention.

As FIG. 7 shows, the comparator 108 obtains the signal Y' from the subtracting amplifier 107 (S701) and judges whether an absolute value of Y' is over a predetermined threshold $\alpha$ (S702). The predetermined threshold $\alpha$ is to judge whether Y' is almost zero or not. When Y' is strictly judged to be zero, $\theta_p$ needs frequently changing even when slightly out of zero and is not stabilized.

In order to avoid this, when Y' is within a tolerance of the threshold $\alpha$ from zero, it is regarded as zero. $\alpha$ is fixed according to the $A_{tgt}$, e.g., in a range of 1 to 5% of the $A_{tgt}$.

When Y' has an absolute value not greater than $\alpha$ (S702/NO), the comparator 108 judges the present $\theta_p$ precisely denotes a rotational position of the rotor, and finishes operation. On the other hand, when Y' has an absolute value greater than $\alpha$ (S702/YES), the comparator 108 judges whether Y' is a positive or a negative value (S703).

When Y' is a positive value (S703/YES), $\theta_p$ is smaller than $\theta$ in a rotation of vector as FIG. 6 shows. Therefore, the comparator 108 produces an UP signal to increase $\theta_p$ (S704), and finishes operation.

When Y' is a negative value (S703/NO), $\theta_p$ is larger than $\theta$ in a rotation of vector as FIG. 6 shows. Therefore, the comparator 108 produces a DN signal to decrease $\theta_p$ (S705), and finishes operation. These UP and DN signals increase and decrease the detective angle $\theta_p$. The comparator 108 repeated the process at high speed to constantly set $\theta_p$ according to a rotational angle of the rotor. The UP and DN signals produced from the comparator 108 are entered in a $\theta_{step}$ adjustor 110 and an angle setter 109.

The signal X' produced from the summing amplifier 114 is entered in an angle adjustor 115. The angle adjustor 115 is a block assisting to set $\theta_p$ according to the signal Y'. In FIG. 7, even when a vector subjected to a rotational process has an angle of 180° from the formulae (5) and (6), the judgment same as when the angle is 0° is made. Namely, $\theta_p$ possibly has an error of 180°.

Figure 8:
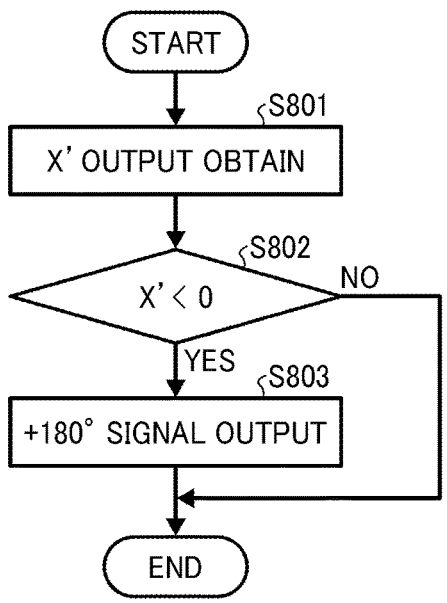
FIG. 8 is a flowchart showing operation of an embodiment of an angle adjustor of the present invention.

Accordingly, the angle adjustor 115 observes X' to resolve the error of $\theta_p$. An operation of the angle adjustor 115 is explained, referring to FIG. 8. As FIG. 8 shows, when the angle adjustor 115 obtains the signal X' from the summing amplifier 114 (S801), it determines whether X' is positive or negative (S802).

When X' is positive (S802/NO), the operation in FIG. 7 may be continued to preferably set $\theta_p$ and the angle adjustor 115 finishes operation.

When X' is negative (S802/YES), a vector after rotation in FIG. 6 is close to 180°. In this case, the angle adjustor 115 produces a +180° signal to rotate $\theta_p$ by 180° (S803), and finishes operation. This operation prevents $\theta_p$ from having an error of 180°. The +180° signal produced by the angle adjustor 115 is entered in the angle setter 109.

The angle setter 109 refers to $\theta_{step}$, based on the UP and DN signals entered from the comparator 108 and the +180° signal entered from the angle adjustor 115 to adjust $\theta_p$. An operation of the angle setter 109 is explained, referring to FIG. 9.

Figure 9:
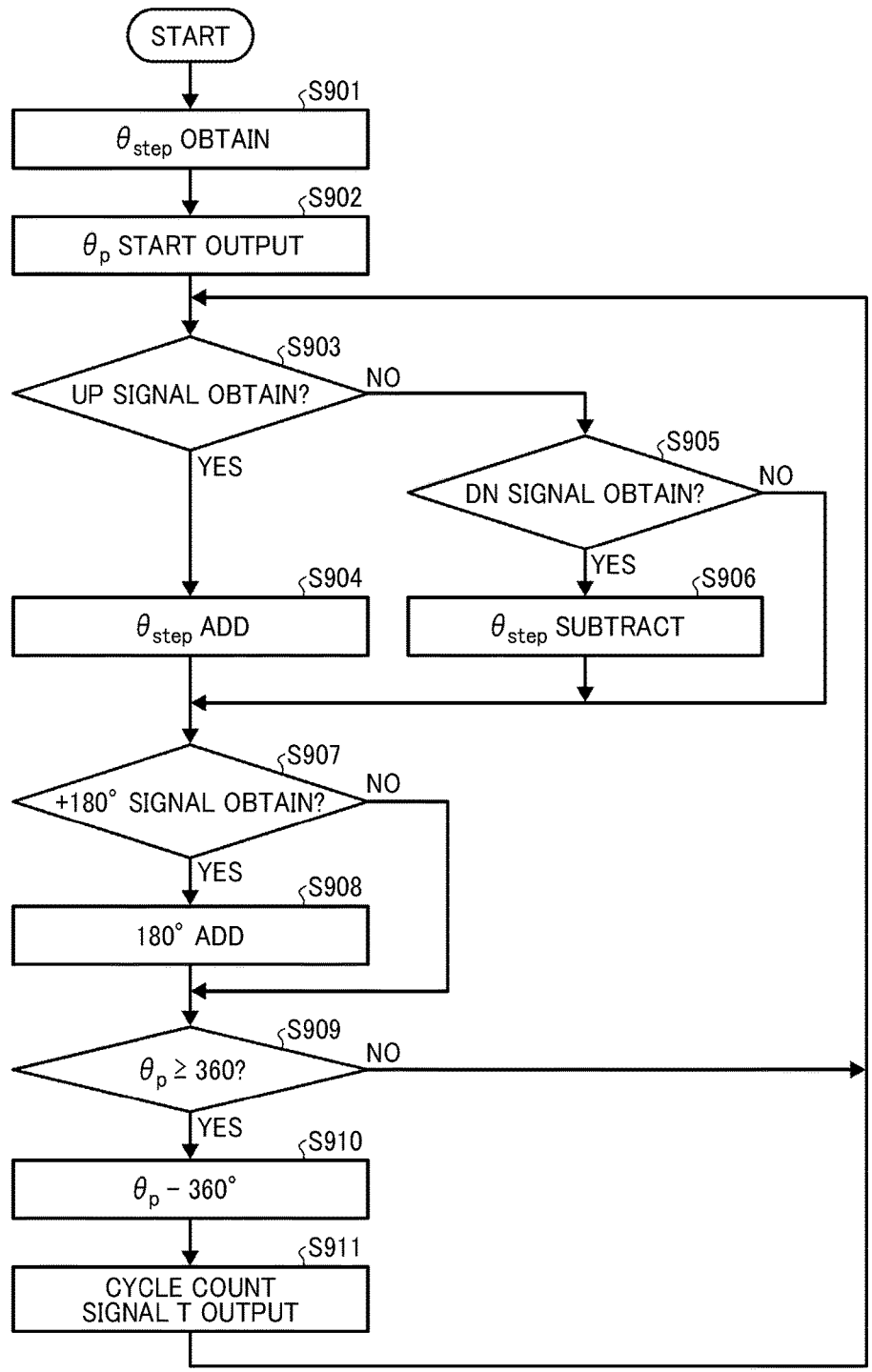
FIG. 9 is a flowchart showing operation of an embodiment of an angle setter of the present invention.

As FIG. 9 shows, the angle setter 109 obtains $\theta_{step}$ from a $\theta_{step}$ memory 111 (S901), and starts producing $\theta_p$ from the obtained $\theta_{step}$ as an initial value (S902). Then, the angle setter 109 obtains the UP signal produced by the comparator 108 in FIG. 7 (S903/YES) and adds $\theta_{step}$ to $\theta_p$ (S904). $\theta_p$ is increased by $\theta_{step}$.

Meanwhile, instead of the UP signal (S903/NO), the angle setter 109 obtains the DN signal produced by the comparator 108 in FIG. 7 (S905/YES) and reduces $\theta_{step}$ from $\theta_p$ (S906). $\theta_p$ is decreased by $\theta_{step}$.

After S904 or S906, or when neither of the UP and the DN signals is obtained (S905/NO), the angle adjustor 115 produces a +180° signal in FIG. 8. When the angle setter 109 obtains the +180° signal (S907/YES), the angle setter 109 adds 180° to $\theta_p$ (S908).

Then, the angle setter 109 judges whether $\theta_p$ is not less than 360° (S909). When less than 360° (S907/NO), the angle setter 109 repeats process from S903. When not less than 360° (S907/YES), the angle setter 109 reduces 360° from $\theta_p$ (S910) and produces a cycle count signal T as well (S911). The cycle count signal is explained in detail later.

The angle setter 109 repeats this process to adjust $\theta_p$ according to the operations of the comparator 108 and the angle adjustor 115 and produce $\theta_p$ according to the rotational position of the rotor 200. Namely, the detective angle multiplier 106, the subtraction amplifier 107, the comparator 108, the angle setter 109 and a sine wave generator 113 are connected with each other to work as a rotation detector. The detective angle multiplier 106 and the subtraction amplifier 107 are connected with each to work as a rotation operator, and the comparator 108 and the angle setter 109 are connected with each to work as a detective angle setter.

According to FIG. 9, an angle added to or reduced from $\theta_p$ according to one time UP signal and DN signal is $\theta_{step}$. However, when 0 according to the rotational position of the rotor in FIG. 5 is largely different from $\theta_p$, addition or reduction of $\theta_{step}$ is repeated for plural times, resulting in inefficient process.

Figure 10:
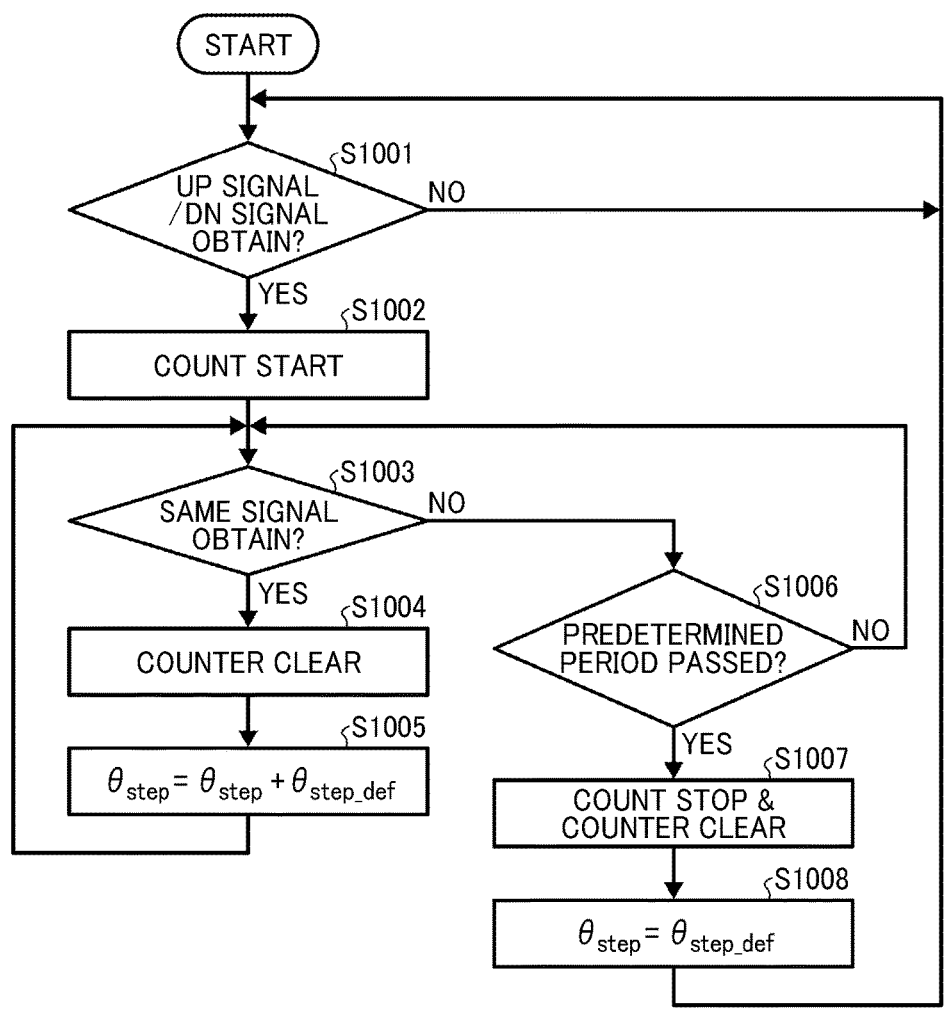
FIG. 10 is a flowchart showing operation of an embodiment of $\theta_{step}$ adjustor of the present invention.

The $\theta_{step}$ adjustor 110 is to solve this problem. The operation of the $\theta_{step}$ adjustor 110 is explained, referring to FIG. 10. As FIG. 10 shows, the $\theta_{step}$ adjustor 110 waits until obtaining an UP signal or a DN signal from the comparator 108 (S1001/NO). Obtaining an UP signal or a DN signal (S1001/YES), the $\theta_{step}$ adjustor 110 starts count (S1102).

After starting count, without obtaining the same signal obtained in S1001 (S1003/NO), when the count reaches a specific value in a predetermined period (S1006/YES), the $\theta_{step}$ adjustor 110 stops and clears count (S1007). The $\theta_{step}$ adjustor 110 memorizes $\theta_{step}$ in the $\theta_{step}$ memory 111 as $\theta_{step\_def}$(S1008) which is a default, and repeats process from S1001.

Meanwhile, after starting count, when obtaining the same signal obtained in S1001 (S1003/YES) before counting a specific value equivalent to a predetermined period (S1006/NO), the $\theta_{step}$ adjustor 110 clears count and adds $\theta_{step\_def}$ which is a default to $\theta_{step}$ to be memorized in the $\theta_{step}$ memory 111 (S1005), and repeats process from S1003.

When the UP signals and DN signals are continuously entered in a predetermined periods, the $\theta_{step}$ adjustor 110 judges a difference between the rotational position $\theta$ of the rotor and the present $\theta_p$ is large and adjust $\theta_{step}$ memorized in the $\theta_{step}$ memory 111 to enlarge $\theta_{step}$ which is a unit of adjusting $\theta_p$. This avoid inefficient process of repeating adjustment of $\theta_p$ when a difference between the rotational position $\theta$ of the rotor and the present $\theta_p$ is large. Namely, the $\theta_{step}$ adjustor 110 works as a unit angle adjustor.

$\theta_p$ produced from the angle setter 109 is entered in the sine wave generator 113 and an angle convertor 112. The sine wave generator 113 produces $\sin\theta_p$ and $\cos\theta_p$ according to $\theta_p$, based on sine and cosine lookup table covering various angles. The $\sin\theta_p$ and the $\cos\theta_p$ are entered in the detective angle multipliers. Multiplication processes in the sine wave multiplier 106a, the cosine wave multiplier 106b, the cosine wave multiplier 106c and the sine wave multiplier 106d are executed.

In addition to $\theta_p$, the cycle count signal T is entered in the angle convertor 112 from the angle setter 109. The angle convertor 112 converts $\theta_p$ into a rotational angle $\theta_R$ of the rotor 200. As explained in FIGS. 1 and 2, one cycle of the rotor 200 is equivalent to six cycles of sine curves produced by the hall elements 201, 202 and 203. Since $\theta_p$ produced by the angle setter 109 is an angle based on signals produced by the hall elements 201, 202 and 203, $\theta_p$ is not a rotational angle of the rotor 200, but an angle representing a phase in a one cycle of the sine curve in FIG. 2.

Therefore, the angle convertor 112 counts the cycle count signal T with a counter counting 0 to 5 to determine to which cycle of the six sine curve cycles the rotational position of the rotor 200 is equivalent and the detailed rotational position thereof considering $\theta_p$.

Specifically, when the cycle count signal T is $T_{count}$, the angle convertor 112 converts $\theta_p$ into a rotational angle $\theta_R$ from the following formula (7). Thus, the rotation detector 100 detects and produces the rotational angle $\theta_R$ of the rotor 200.

$$\theta_R=(360°\times T_{count}+\theta_p)/6 \quad (7)$$

In the embodiment of the rotation detector 100, as FIG. 1 shows, the rotational position of the rotor 200 is detected, based on the signals produced from the two hall elements selected from the hall elements 201 to 203 located along the rotation of the rotor 200.

The signals produced from the hall elements are theoretically sine curves as FIGS. 2 and 3 show. When the rotor 200 has eccentricity, the cycle and the amplitude partially have distortions according to the phase of the sine curve. When the rotation detector 100 determines $\theta_R$, based on the signals including the distortions, the resultant $\theta_R$ includes an error according thereto.

The distortion of the signal due to the eccentricity is a cyclic error having cyclicity for one cycle of the rotor 200. When the two hall elements located at a shift of 180° in the rotational position of the rotor 200 are selected, $\theta_R$ including an error can be cancelled.

However, in FIG. 1, there are no hall elements located at a complete shift of 180°. In the 12-pole brushless motor, signals produced from hall elements located at a shift of 180° have the same phase, which influences on the basic function of detecting an angle of the rotor 200, based on to signals having phases different from each other of the rotation detector 100.

Therefore, in the embodiment of the rotation detector 100, when the two hall elements having phases different from each other are selected, the hall elements located at a shift of an angle as close to 180° as possible are selected. In other words, the two hall elements located as far as possible from each other are selected.

In FIG. 1, when the hall element 201a is selected as one hall element, the hall element 202b or 203b is selected as the other. Thus, the cyclic errors included in the signals having the shape of sine curves produced from the two hall elements cancel each other. Therefore, the resultant $\theta_p$ and $\theta_R$ decrease in cyclic errors due to the eccentricity.

When there is an error in as shown in FIG. 2 (b), one hall element produces a signal at a position having a large amplitude and a short wavelength, and the other hall element produces a signal at a position having a small amplitude and a long wavelength. Therefore, $X_0$ and $Y_0$ determined from the two signals decrease in error of wavelength, i.e., error of phase.

Error of amplitude in FIG. 2 (b) remains. The error of amplitude appears as errors of $X_0$ and $Y_0$. In the embodiment, $X_0$ and $Y_0$ are used as original values representing a vector component as explained in FIG. 5. When $X_0$ and $Y_0$ have errors, the vector angle has an error, resulting in an error of $\theta_p$.

In the embodiment of the rotation detector 100, the error of amplitude is corrected by the amplitude detectors 103X and 103Y, the gain generators 104X and 104Y, and the gain multipliers 105X and 105Y in FIG. 1. Namely, an amplitude having an ideal sine curve is FIG. 2 (a) can be used as the amplitude $A_{tgt}$. Thus, the influence of cyclic error to the rotation of the rotor 200 as explained in FIG. 2 (b) is reduced, and an angle of the rotor 200 can be preferably detected.

In order to further improve effect of reducing the cyclic error, the selected two hall elements are preferably shifted at least 90° or more relative to the rotational position of the rotor 200. In other words, the selected two hall elements preferably have an angle of from 90 to 270°, more preferably from 120 to 240°, and furthermore preferably from 150 to 210° in the rotational angle of the rotor 200.

On the other hand, the hall elements 201, 202 and 203 as shown in FIG. 1 are located in a line. The location of the hall element according to configuration of the brushless motor applied in the rotation detector 100. Therefore, when the two hall elements producing signals having phases different from each other are selected, the hall elements located at a shift of an angle as close to 180° as possible, as far as possible from each other, possibly farthest from each other are preferably selected.

As mentioned above, the embodiment of the rotation detector 100 can detect a rotational position of a rotor in consideration of an error due to eccentricity thereof without a limit on the design thereof.

In the embodiment, the vector rotates anticlockwise in FIG. 5 according to the rotation of the rotor 200. Therefore, $\theta_p$ becomes large according to the rotation of the rotor 200. In S909 in FIG. 9, whether $\theta_p$ is over 360° or not is judged, and in S910, 360° is reduced.

On the contrary, the vector possibly rotates clockwise in FIG. 5 according to the rotation of the rotor 200. In this case, $\theta_p$ becomes small according to the rotation of the rotor 200. In S909 in FIG. 9, whether $\theta_p$ is below 0° or not is judged, and in S910, 360° is added.

In the embodiment, as explained in FIG. 1, all the signals produced by the hall elements are entered in both mux 101X and 101Y, the signals are selected according to select signal sel. Therefore, the above-mentioned two signals reducing a cyclic error can be selected without changing terminals and wirings, and a detector having higher versatility can be provided.

The two signals having phases different from each other need selecting from U-phase, W-phase and V-phase. Namely, in FIG. 1, the signals of the hall element 201a and the hall element 201b cannot be selected. Therefore, when mux 101X selects U-phase, mux 101Y does not select U-phase.

In FIG. 1, all the signals are entered in both of mux 101X and 101Y. The signals to be entered can be reduced if combinations thereof are considered. For examples, U-phase and W-phase signals are entered in mux 101X, and W-phase and V-phase signals are entered in mux 101Y. Thus, all combinations of the signals can be made, and signals lines required to enter the signal the bit number of the select signal sel can be reduced.

On the other hand, when a signal used for detecting the rotational position is previously fixed, the two signal may be directly entered in the summing amplifier 102X and the differential gain amplifier 102Y. This can reduce the circuit scale.

In the embodiment, the maximum value of $\theta_p$ produced by the angle setter 109 is 360°. When beyond 360°, the cycle count signal T is produced. As an angle representing one cyclic angle of the rotor 200 in FIG. 1 with a sine curve phase, 360°×6=2160° may be the maximum value of $\theta_p$ produced by the angle setter 109.

In this case, the angle convertor 112 simply divides $\theta_p$ with 6 to determine the rotational angle $\theta_R$ of the rotor. On the other hand, the sine wave generator 113 reduces 360° from $\theta_p$ to be less than 360°, and produces sine and cosine of the extra angle, based on a lookup table. Thus, the same effect as above can be obtained.

In the embodiment, the functions after the detective angle multiplier 106 in the signal flow explained in FIG. 4 determines $\theta_p$ according to the rotational position of the rotor, using the rotation of the vector as explained in FIG. 6. Only simple functions can realize the modules, the clock number of the circuit and the circuit scale can be reduced.

Based on signals X and Y produced by the gain multipliers 105X and 105Y, respectively, $\theta_p$ can also be determined by the following formula (8).

$$\theta_p = \tan^{-1}(Y/X) \qquad (8)$$

Figure 11:
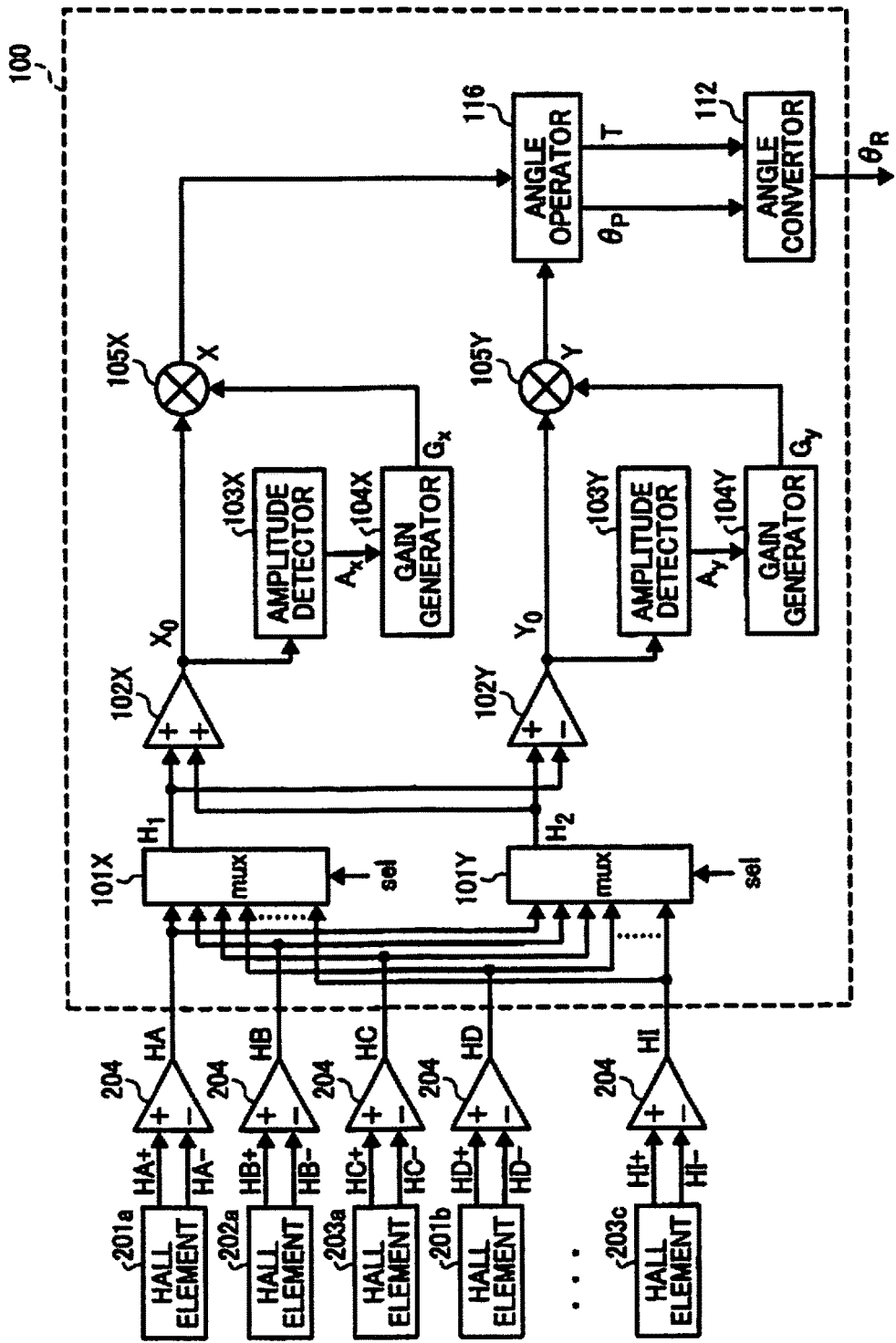
FIG. 11 is a block diagram showing functional configuration of another embodiment of the rotation detector of the present invention.

As shown in FIG. 11, an angle operator 116 performs an operation of the formula (8), based on productions from the gain multipliers 105X and 105Y. When $\theta_p$ exceeds 360° and returns to 0°, a cycle count signal T is produced as above.

However, a high clock process is needed to execute the operation of the formula (8) in real time, following the rotation of the rotor 200. In FIG. 4, lower clock than operating the formula (8) is sufficient.

In the embodiment, the angle steer 109 and the angle convertor 112 determine and produce the rotational angle $\theta_R$. However, this is an example, and the rotation detector 100 detects the rotation of the rotor. Namely, the detector does not produce an angle, but may produce a pulse every time when detecting rotation having a predetermined angle. In this case, the number of bit produced can effectively be reduced.

Figure 12:
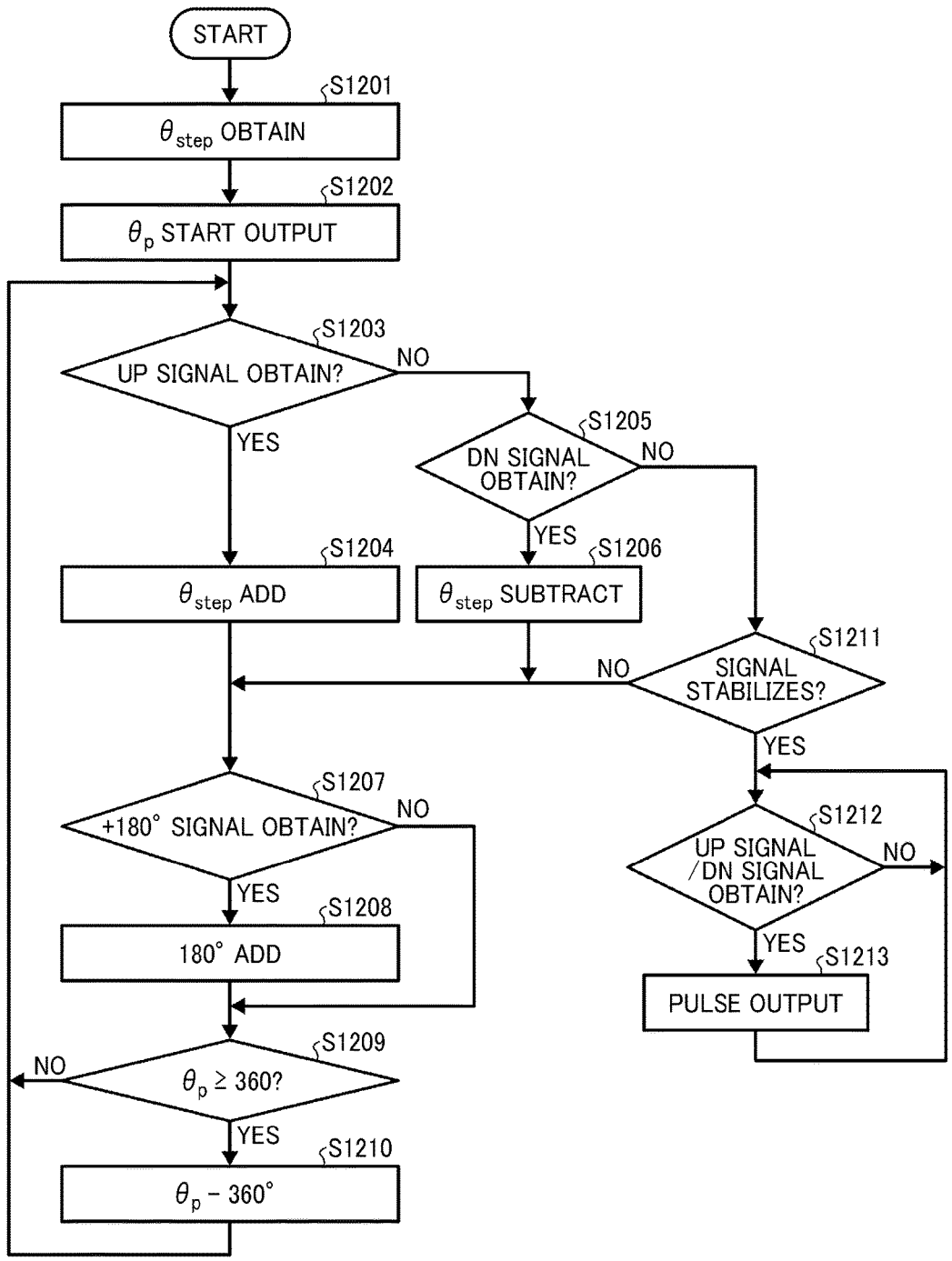
FIG. 12 is a flowchart showing operation of another embodiment of an angle setter of the present invention.

When a pulse is produced every time when a rotation at a predetermined angle, the angle convertor 112 is not needed and the angle setter 109 suffices. The operation of the angle setter 109 in this case is explained according to a flowchart in FIG. 12. FIG. 12 is a flowchart showing the operation of the angle setter 109 when the rotor 200 produces a pulse every time when rotating at a predetermined angle.

In FIG. 12, S1201 to 1210 are the same as S901 to 910 in FIG. 9. In FIG. 12, when neither of UP signals and DN signals is obtained (S1203/NO) and (S1205/NO), the angle setter 109 judges whether the signals are stabilized (S1211).

At the beginning of starting operation of the rotation detector 100, a difference between the vector angle θ X and Y produce according to the rotational position of the rotor and $\theta_p$ by is large, and +180° signal, UP signal and DN signal are thought to continuously be produced.

When $\theta_p$ follows the vector angle θ X and Y produce, every time when the vector angle θ X and Y produce rotates by $\theta_{step}$ according to the rotation of the rotor 200, UP signals are produced. When the rotor 200 rotates reverse, DN signals are produced. This is thought to be a stable status.

Namely, the angle setter 109 judges $\theta_p$ follows the rotation of the rotor 200 and the signal is stabilized (S1211/YES) when obtaining neither of +180° signal, UP signal and DN signal for a predetermined period or more since an UP signal or a DN signal is produced in S1211.

When judging the signal is stabilized, the angle setter 109 produces a pulse (S1213) every time when obtaining an UP signal or a DN signal from the comparator 108 (S1212/YES). In the module having received a pulse, it can be detected that the rotor 200 has rotated by a predetermined angle. $\theta_{step}$ is an angle relevant to the phase of a sine curve. Therefore, an angle detecting rotation with a pulse is six times of $\theta_{step}$ in the embodiment.

In the embodiment, as explained in FIG. 1, the two hall elements producing signals cancelling the cyclic error of the rotor 200 of the brushless motor are selected. The hall elements in the brushless motor may be located to reduce the cyclic error.

In a 3-phase brushless motor, magnets for 2 poles located according to the number of poles are one cycle, and at least each one of hall elements of U-phase, W-phase and V-phase may be located so as to be shifted at an electric angle of 120° each other. When the number of poles is determined, $\theta_{hall}$ which is as close to 180° as possible for one cycle of the rotor 200, and a mounting angle of the hall elements of the U-phase, W-phase and V-phase can be determined by the following formula (9).

$$\theta_{hall}=180°-360°/(n/2\times3) \quad (9)$$

Therefore, mounting angles of the two hall elements from the U-phase, W-phase and V-phase are selected, based on the formula (9), preferable signals can be obtained in the embodiment of the rotation detector 100 of the present invention, and the cyclic error can be more efficiently reduced.

In the embodiment, detection of the rotation of the rotor 200 on a brushless motor is explained. However, this is an example, and when a waveform in FIG. 2 is produced according to the rotational cycle of a rotor, the embodiment of the rotation detector 100 of the present invention is applicable.

Even in that case, based on the two waveforms having phases different from each other, which have been produced from detection result at a position they are shifted at almost 180°, the above process is executed to precisely detect an angle, reducing a cyclic error due to eccentricity of the rotor.

The rotor may be a magnetic material, and instead of the hall element, a TMR (Tunnel Magneto-Resistance) effect element, a Wheatstone Bridge Circuit using GMR (Giant Magneto Resistive) effect element, or an AMR (Anisotropic-Magneto-Resistive) effect element may be used as a magnetic sensor.

As an example of producing a waveform according to the rotational cycle of a rotor, a rotation detector with an optical encoder can be used. Specifically, a marking formed at a predetermined angle over a circumference of a rotor is optically detected to produce a pulse according to the detection thereof. The pulse is converted into a sine curve according to the cycle of the rotor to similarly apply the embodiment and reduce a cyclic error according thereto.

As another example of producing a waveform according to the rotational cycle of a rotor, a rotation detector with a slit rotation disc, a light source and an optical sensor can be used as well. Specifically, quantity of light from the light source is changed through the slit of the rotation disc to produce a sine curve according to the cycle of the rotor.

Having now fully described the invention, it will be apparent to one of ordinary skill in the art that many changes and modifications can be made thereto without departing from the spirit and scope of the invention as set forth therein.

What is claimed is:

1. A rotation detector for detecting rotation of a rotor, based on a signal produced according to rotation of the rotor, having a waveform according to a rotational cycle thereof, comprising:
a signal obtaining unit configured to select from signals produced from plural rotation detecting elements including plural sets of rotation detecting elements and individual rotation detecting elements in each set of the plural sets of the rotation detecting elements being located at different positions relative to a rotation angle of the rotor and having a same phase, two signals having different phases produced from two of the plural rotation detecting elements located farthest relative to the rotation angle of the rotor;
a vector operating unit configured to determine a vector according to a rotational angle of the rotor, based on the two signals; and
a rotation detecting unit configured to detect rotation of the rotor, based on the vector.

2. The rotation detector of claim 1, wherein the vector operating unit determines two orthogonal components by addition and subtraction of the two signals and performs a gain operation for determining equal peak values of the two orthogonal components with which to determine a vector according to a rotational angle of the rotor.

3. The rotation detector of claim 1, wherein the rotation detecting unit comprises:
a rotation operating part configured to perform rotation operation on the vector for a detective angle set; and
a detective angle setting part configured to set the detective angle such that the vector after subjected to the rotation operation follows a specified standard angle to detect rotation of the rotor, based on the detective angle.

4. The rotation detector of claim 3, wherein the detective angle setting part performs addition and subtraction with a predetermined unit angle to change the detective angle such that the vector after subjected to the rotation operation follows the specified standard angle when a difference between the vector after subjected to the rotation operation and the specified standard angle is not less than the specified standard angle.

5. The rotation detector of claim 4, further comprising a unit angle adjusting part configured to enlarge the unit angle when a difference between the vector after subjected to the rotation operation and the specified standard angle is not less than the specified standard angle.

6. The rotation detector of claim 5,
wherein the detective angle setting part is further configured to produce a signal for ordering the detective angle to be subject to addition and subtraction when a difference between the vector after subjected to the rotation operation and the specified standard angle is not less than the specified standard angle, and
wherein the unit angle adjusting part is further configured to enlarge the unit angle when a signal for ordering the detective angle to be subject to addition or a signal for ordering the detective angle to be subject to subtraction is continuously entered in a specified period.

7. The rotation detector of claim 3, wherein the detective angle setting part is further configured to determine whether the vector after subjected to the rotation operation follows the specified standard angle, based on at least one of components forming the vector subjected to the rotation operation.

8. The rotation detector of claim 1, wherein the rotor is an element of a 3-phase motor.

9. The rotation detector of claim 1, wherein the two signals are produced from two elements located at positions substantially circumferentially opposing each other about a diametric of the rotor.

10. The rotation detector of claim 9, wherein each of the individual rotation detecting elements is positioned on the rotor about forty degrees from each other.

11. A rotation detector for detecting rotation of a rotor, based on a signal produced according to rotation of the rotor, having a waveform according to a rotational cycle thereof, comprising:
a signal obtaining unit configured to select from signals produced from plural rotation detecting elements including plural sets of rotation detecting elements and individual rotation detecting elements in each set of the plural sets of the rotation detecting elements being located at different positions relative to a rotation angle of the rotor and having a same phase, two signals having different phases produced from two of the plural rotation detecting elements located farthest relative to the rotation angle of the rotor;

a vector operating unit configured to determine a vector according to a rotational angle of the rotor, based on the two signals; and a rotation detecting unit configured to detect rotation of the rotor, based on the vector, wherein each of the two signals is produced when the rotation of the rotor is detected in each of positions far from each other by 90 to 270° in a rotational angle of the rotor.

12. The rotation detector of claim 11, wherein the rotor is an element of a 3-phase motor.

13. The rotation detector of claim 11, wherein the two signals are produced from two elements located at positions substantially circumferentially opposing each other about a diametric of the rotor.

14. The rotation detector of claim 13, wherein each of the individual rotation detecting elements is positioned on the rotor about forty degrees from each other.

15. A method of detecting rotation of a rotor, based on signals produced from plural rotation detecting elements located at positions different from each other in a rotational angle of a rotor, having a waveform according to a rotational cycle thereof, comprising:

selecting from signals produced from plural rotation detecting elements including plural sets of rotation detecting elements and individual rotation detecting elements in each set of the plural sets of the rotation detecting elements being located at different positions relative to a rotation angle of the rotor and having a same phase, two signals having different phases produced from two of the plural rotation detecting elements located farthest relative to the rotation angle of the rotor;

determining a vector according to a rotational angle of the rotor, based on the two signals; and detecting rotation of the rotor, based on the vector.

16. The method of detecting rotation of claim 15, wherein the rotor is an element of a 3-phase motor.

17. The rotation detector of claim 15, wherein the two signals are produced from two elements located at positions substantially circumferentially opposing each other about a diametric of the rotor.

18. The method of detecting rotation of claim 17, wherein the individual rotation detecting elements is positioned on the rotor about forty degrees from each other.

19. A rotation detector detecting rotation of a rotor, based on a signal produced according to rotation of the rotor, having a waveform according to a rotational cycle thereof, comprising:

a signal obtaining unit configured to obtain two signals having phases different from each other;

a vector operating unit configured to determine a vector according to a rotational angle of the rotor, based on the two signals; and a rotation operating part configured to perform rotation operation on the vector for a detective angle set; and a detective angle setting part configured to set the detective angle such that the vector after subjected to the rotation operation follows a specified standard angle to detect rotation of the rotor, based on the detective angle;

wherein the detective angle setting part is further configured to determine whether the vector after subjected to the rotation operation follows the specified standard angle, based on at least one of components forming the vector subjected to the rotation operation.

* * * * *